(12) United States Patent
Lai et al.

(10) Patent No.: US 9,978,714 B1
(45) Date of Patent: May 22, 2018

(54) STRUCTURE AND METHOD OF BONDING CHIP WITH ELECTRONIC CIRCUIT

(71) Applicant: GRAPHENE SECURITY LIMITED, Manchester (GB)

(72) Inventors: Chung-Ping Lai, Hsinchu County (TW); Kuo-Hsin Chang, Chiayi County (TW)

(73) Assignee: GRAPHENE SECURITY LIMITED, Manchester (GB)

( * ) Notice: Subject to any disclaimer, the term of this patent is extended or adjusted under 35 U.S.C. 154(b) by 0 days. days.

(21) Appl. No.: 15/651,894

(22) Filed: Jul. 17, 2017

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/29* | (2006.01) |
| *H01L 23/66* | (2006.01) |

(52) U.S. Cl.
CPC ............ *H01L 24/85* (2013.01); *H01L 23/293* (2013.01); *H01L 23/66* (2013.01); *H01L 24/09* (2013.01); *H01L 24/45* (2013.01); *H01L 2223/6611* (2013.01); *H01L 2223/6677* (2013.01); *H01L 2224/45644* (2013.01)

(58) Field of Classification Search
USPC ........................ 257/786, 618–628, 527, 594, 257/E21.122–E21.128, E21.567–E21.57; 438/33, 68, 107, 113, 460–465, 963–974
See application file for complete search history.

(56) References Cited

U.S. PATENT DOCUMENTS 7,443,019 B2 * 10/2008 Bauer ............... H01L 23/49524
257/692
2013/0049564 A1* 2/2013 Jung ..................... H01L 33/641
313/45

* cited by examiner

*Primary Examiner* — Tram H Nguyen

(57) ABSTRACT

A bonding structure of a chip and an electronic circuit contains: a chip holder, a chip accommodated in the chip holder, multiple conductive feet electrically connected with the chip, and an electronic circuit. The chip and the multiple conductive feet are covered by a packaging material, and a part of each of the multiple conductive feet exposes outside the packaging material to form an extension. The electronic circuit includes a porous substrate and an electric circuit connected on the porous substrate, wherein the electric circuit is formed from conductive inks which penetrate into the porous substrate, and the extension is inserted through the electric circuit, hence the extension is electrically connected with the electric circuit.

17 Claims, 4 Drawing Sheets

STRUCTURE AND METHOD OF BONDING CHIP WITH ELECTRONIC CIRCUIT

FIELD OF THE INVENTION

The present invention relates to a structure and a method of bonding a chip with an electronic circuit which reduce adhesion cost and adhere the chip and the electronic circuit together quickly and easily.

BACKGROUND OF THE INVENTION

Multiple conductive feet of a chip are bonded with an electronic circuit by means of conductive solder in a welding manner, wherein the conductive solder is heated to a melting point so as to melt and attach on each of the multiple conductive feet and the electronic circuit, and the chip and the electronic circuit are bonded together, after the conductive solder solidifies. However, a high temperature occurs to influence the chip in the welding process.

To overcome above-mentioned problem, a conductive adhesive has been developed and applied to bond the chip and the electronic circuit together. Nevertheless, gaps produce after the conductive adhesive solidifies, and metal powders in the conductive adhesive increases bonding cost.

The conductive adhesive contains any one of anisotropic conductive film (ACF), anisotropic conductive adhesives (ACA), and anisotropic conductive paste (ACP). However, the conductive adhesive is not stable, for example, electrical conductivity of the conductive adhesive decreases, because metal filler in the conductive adhesive oxidizes. Furthermore, the conductive adhesive cannot bond the chip and the electronic circuit stably after a period of using time, and it takes a long time to solidify for the conductive adhesive.

The present invention has arisen to mitigate and/or obviate the afore-described disadvantages.

SUMMARY OF THE INVENTION

The primary objective of the present invention is to provide a structure and a method of bonding a chip with an electronic circuit which reduce adhesion cost and adhere the chip and the electronic circuit together quickly and easily.

To obtain above-mentioned objective, a bonding structure of a chip and an electronic circuit provided by the present invention contains: a chip holder, a chip accommodated in the chip holder, multiple conductive feet electrically connected with the chip, and an electronic circuit.

The chip and the multiple conductive feet are covered by a packaging material, and a part of each of the multiple conductive feet exposes outside the packaging material to form an extension. The electronic circuit includes a porous substrate and an electric circuit connected on the porous substrate, wherein the electric circuit is formed from conductive inks which penetrate into the porous substrate, and the extension is inserted through the electric circuit, hence the extension is electrically connected with the electric circuit.

Preferably, the chip is radio frequency identification (RFID) chip, and the electronic circuit is radio frequency identification (RFID) antenna.

Preferably, the chip is electrically connected with each conductive foot by using a gold wire in a wire bonding manner.

Preferably, the chip is mounted on the chip holder by way of epoxy resin.

Preferably, the porous substrate is made of paper or is a polymer film, and the polymer film is surface treaded.

Preferably, the polymer film is made of polyethylene terephthalate (PET) or polyimide (PI), Preferably, the packaging material is ceramic material or plastic material.

Preferably, the plastic material includes any one of epoxy, resin, and acrylic acid.

Preferably, the bonding structure of the present invention further contains: a fixing glue coated on an adhesion position of the extension and the electric circuit.

In addition, a method of bonding a chip with an electronic circuit comprises steps of:

mounting the chip on a chip holder;

electrically connecting the chip with multiple conductive feet;

covering the chip and the multiple conductive feet by using a packaging material, wherein a part of each of the multiple conductive feet exposes outside the packaging material to form an extension;

forming an electric circuit on a porous substrate, wherein the electric circuit is formed from conductive inks which penetrate into the porous substrate so as to produce an electric circuit; and inserting the extension through the electric circuit, hence the extension is electrically connected with the electric circuit.

Preferably, the chip is mounted on the chip holder by way of epoxy resin.

Preferably, the chip is electrically connected with each conductive foot by using a gold wire in a wire bonding manner.

Preferably, the porous substrate is made of paper or is a polymer film, and the polymer film is surface treaded.

Preferably, the polymer film is made of polyethylene terephthalate (PET) or polyimide (PI).

Preferably, the packaging material is ceramic material or plastic material.

Preferably, the plastic material includes any one of epoxy, resin, and acrylic acid.

Preferably, the method of the present invention further contains step of fixing the extension of each conductive foot on an adhesion position of the extension and the electric circuit by way of epoxy resin.

DETAILED DESCRIPTION OF THE PREFERRED EMBODIMENTS

Figure 1:
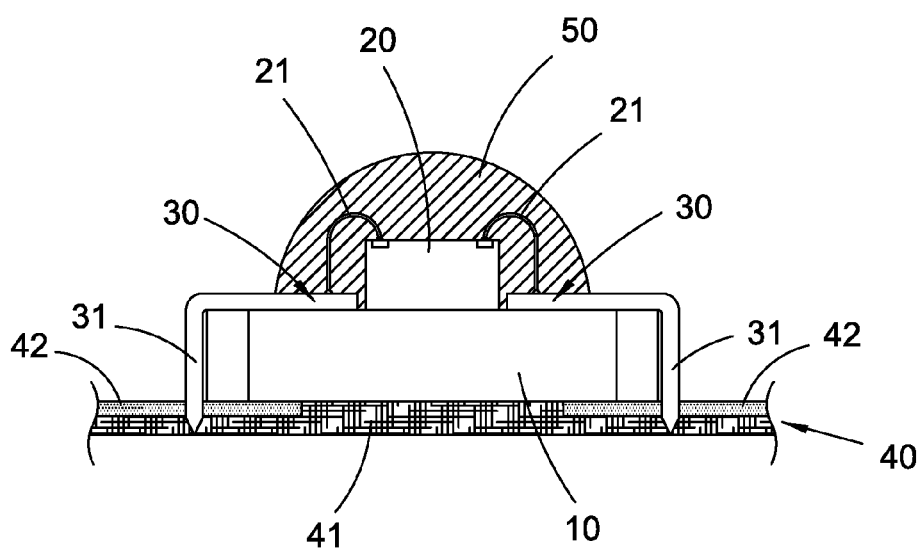
FIG. 1 is a cross sectional view showing the assembly of a bonding structure of a chip and an electronic circuit according to a first embodiment of the present invention.
Figure 2:
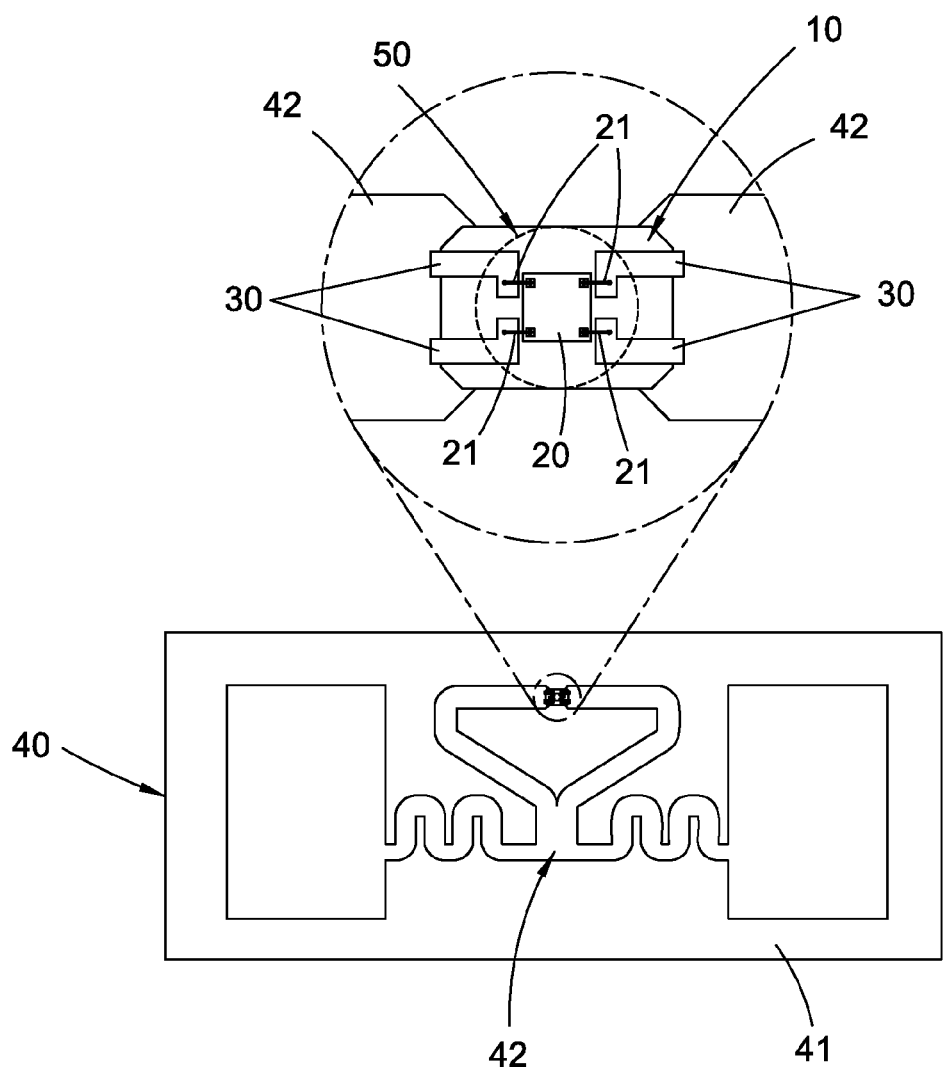
FIG. 2 is a top plan view showing the assembly of the bonding structure of the chip and the electronic circuit according to the first embodiment of the present invention.

With reference to FIGS. 1 and 2, a bonding structure of a chip and an electronic circuit according to a first embodiment of the present invention comprises: a chip holder 10, a chip 20 accommodated in the chip holder 10, multiple conductive feet 30 electrically connected with the chip 20, and an electronic circuit 40.

The chip 20 and the multiple conductive feet 30 are covered by a packaging material 50, and a part of each of the multiple conductive feet 30 exposes outside the packaging material 50 to form an extension 31. The electronic circuit 40 includes a porous substrate 41 and an electric circuit 42 connected on the porous substrate 41, wherein the electric circuit 42 is formed from conductive inks which penetrate into the porous substrate 41, and the extension 31 extends to the electric circuit 42. Preferably, a distal end of the extension 31 is a taper tip so as to insert through the electric circuit 42, hence the extension 31 is electrically connected with the electric circuit 42.

Figure 3:
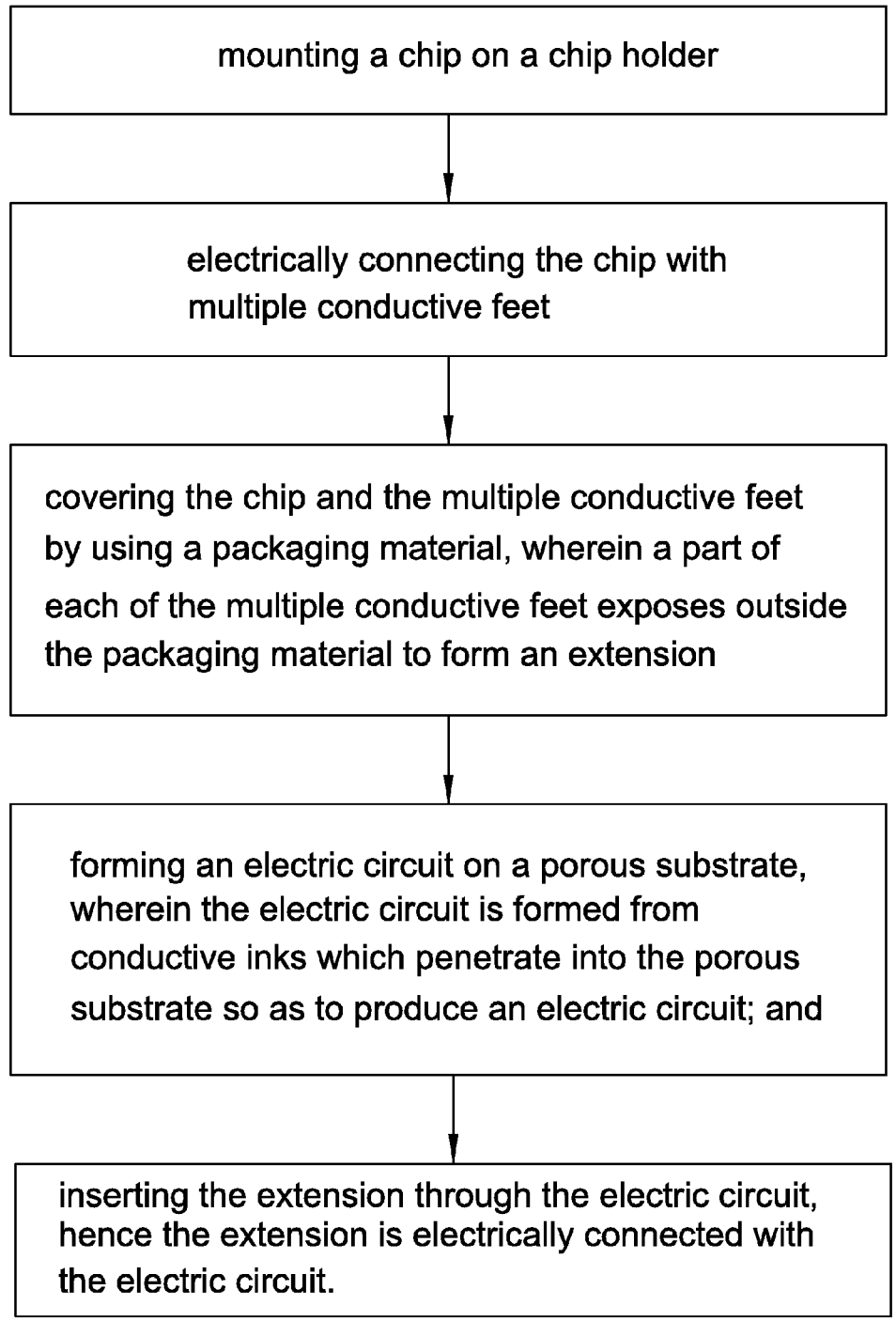
FIG. 3 is a flow chart of a method of bonding the chip with the electronic circuit according to the first embodiment of the present invention.

Referring to FIG. 3, a method of bonding a chip with an electronic circuit according to the first embodiment of the present invention comprises steps of:

mounting the chip on the chip holder;

electrically connecting the chip with multiple conductive feet;

covering the chip and the multiple conductive feet by using the packaging material, wherein a part of each of the multiple conductive feet exposes outside the packaging material to form the extension of each conductive foot;

forming the electric circuit on the porous substrate, wherein the electric circuit is formed from the conductive inks which penetrate into the porous substrate so as to produce the electric circuit; and inserting the extension through the electric circuit, hence the extension is electrically connected with the electric circuit.

The chip 20 is mounted on the chip holder 10 by way of epoxy resin (i.e. insulation adhesive), and the chip 20 is electrically connected with each conductive foot 30 by using a gold wire 21 in a wire bonding manner. The packaging material 50 is ceramic material or plastic material, and the plastic material includes any one of epoxy, resin, and acrylic acid. The chip holder 10 is made of metal, such as copper. To reduce a packaging size of the chip, a lead frame is not used in the bonding structure of the chip and the electronic circuit. Preferably, the chip 20 is radio frequency identification (RFID) chip, and the electronic circuit 40 is radio frequency identification (RFID) antenna which is electrically connected with the RFID chip.

The porous substrate 41 is made of paper so that the conductive inks penetrate into the porous substrate 41 to form the electric circuit 42. After inserting the extension 31 through the electric circuit 42, between the extension 31 and the electric circuit 42 is defined a contact area configured to achieve stable electrical connection. The conductive inks are any one of graphene, graphite flakes, and metal powders (such as silver powders).

Preferably, the porous substrate 41 is a polymer film made of polyethylene terephthalate (PET) or polyimide (PI), and the polymer film is surface treaded by means of alkalization or ultraviolet (UV)/ozone.

Preferably, a thickness of the electric circuit 42 is within 10 μm to 60 μm.

Preferably, the extension 31 inserts into the porous substrate 41 through the electric circuit 42. Alternatively, the extension 31 only inserts into the electric circuit 42 but not insert into the porous substrate 41.

Figure 4:
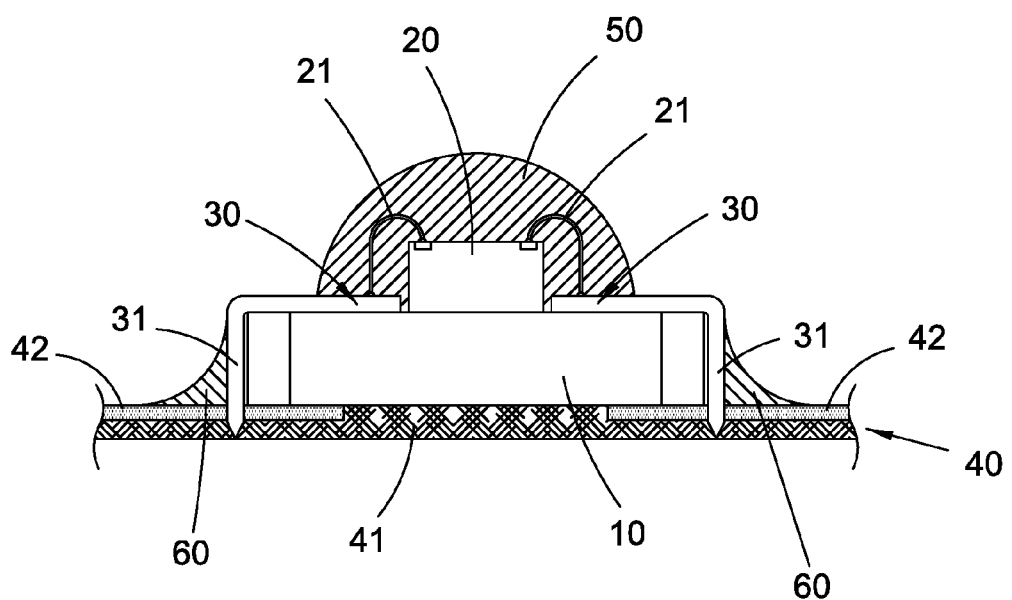
FIG. 4 is a cross sectional view showing the assembly of a bonding structure of a chip and an electronic circuit according to a second embodiment of the present invention.

As shown in FIG. 4, in a second embodiment, a fixing glue 60 coated on an adhesion position of the extension 31 and the electric circuit 42 so as to prevent a removal of the chip 20 (inclusive of the packaging material 50 and the conductive foot 30) from the porous substrate 41.

In this embodiment, the chip 20 is mounted on the chip holder 10 by way of the epoxy resin (i.e. insulation adhesive), and the chip 20 is electrically connected with each conductive foot 30 by using a gold wire 21 of 0.8 mil in the wire bonding manner. The epoxy resin is used as the packaging material 50 so as to cover the chip 20 and each conductive foot 30, wherein a part of each conductive foot 30 exposes outside the packaging material 50 to form the extension 31 of each conductive foot 30, wherein a length of the extension 31 below the packaging material 50 is 0.5 mm, the chip 20 is RFID chip, and the electronic circuit 40 is RFID antenna which is electrically connected with the RFID chip.

The porous substrate 41 is made of paper, the electric circuit 42 is made of the conductive inks which are graphene, and the conductive inks penetrate into the electronic circuit 40, wherein a total thickness of the porous substrate 41 and the electric circuit 42 is 0.2 mm, and the extension 31 is mechanically or manually inserted into the porous substrate 41 via the electric circuit 42, hence the extension 31 is electrically connected with the electric circuit 42.

To compare a comparison sample with the electronic circuit 40 of the present invention, a RFID antenna of the comparison sample is identical to the electronic circuit 40 (i.e. the RFID antenna), and anisotropic conductive paste (ACP) adheres the RFID chip with the RFID antenna and is solidified for 30 seconds at 180° C. so that the RFID chip electrically connects with the RFID antenna. Accordingly, the bonding structure of the present invention is compared with the comparison sample as shown in Table 1.

The Table 1 shows a test result of reading distances of the bonding structure of the first embodiment and the comparison sample, wherein a reading distance of the bonding structure of the first embodiment is more than that of the comparison sample.

TABLE 1

|  | Reading distance (cm) | Equivalent radiated power EIRP (dBm) |
| --- | --- | --- |
| First embodiment | 64 | −15 |
| Comparison sample | 47 | −15 |

The Table 2 shows a test result of writing distances of the bonding structure of the first embodiment and the comparison sample, wherein a writing distance of the bonding structure of the first embodiment is twice longer than that of the comparison sample.

TABLE 2

|  | Writing distance (cm) | Equivalent radiated power EIRP (dBm) |
| --- | --- | --- |
| First embodiment | 41 | −15 |
| Comparison sample | 21 | −15 |

The Table 3 shows a test result of writing times of the bonding structure of the first embodiment and the comparison sample, wherein writing data of the bonding structure of the first embodiment and the comparison sample are the same, and a writing speed of the bonding structure of the first embodiment is twice quicker than that of the comparison sample.

TABLE 3

|  | Time (ms) | Equivalent radiated power EIRP (dBm) |
|---|---|---|
| First embodiment | 2.767 | −15 |
| Comparison sample | 4.042 | −15 |

The Table 4 shows a test result of radiation powers of the bonding structure of the first embodiment and the comparison sample, wherein the radiation powers of the bonding structure of the first embodiment and the comparison sample are identical, and sensitivities at any angles are the same (e.g. within 1 dam).

TABLE 4

| First embodiment | | | | | |
|---|---|---|---|---|---|
| Angle (degree) | 0 | 45 | 90 | 135 | 180 |
| Equivalent radiated power EIRP(dBm) | −30 | −30 | −29 | −28 | −29 |
| Comparison sample | | | | | |
| Angle (degree) | 0 | 45 | 90 | 135 | 180 |
| Equivalent radiated power EIRP(dBm) | −32 | −33 | −32 | −31 | −32 |

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A bonding structure of a chip and an electronic circuit comprising: a chip holder, a chip accommodated in the chip holder, multiple conductive feet electrically connected with the chip, and an electronic circuit;
    wherein the chip and the multiple conductive feet are covered by a packaging material, and a part of each of the multiple conductive feet exposes outside the packaging material to form an extension;
    wherein the electronic circuit includes a porous substrate and an electric circuit connected on the porous substrate, wherein the electric circuit is formed from conductive inks which penetrate into the porous substrate, and the extension is inserted through the electric circuit, hence the extension is electrically connected with the electric circuit.

2. The bonding structure as claimed in claim 1, wherein the chip is radio frequency identification (RFID) chip, and the electronic circuit is radio frequency identification (RFID) antenna.

3. The bonding structure as claimed in claim 1, wherein the chip is electrically connected with each conductive foot by using a gold wire in a wire bonding manner.

4. The bonding structure as claimed in claim 1, wherein the chip is mounted on the chip holder by way of epoxy resin.

5. The bonding structure as claimed in claim 1, wherein the porous substrate is made of paper or is a polymer film, and the polymer film is surface treaded.

6. The bonding structure as claimed in claim 5, wherein the polymer film is made of polyethylene terephthalate (PET) or polyimide (PI).

7. The bonding structure as claimed in claim 1, wherein the packaging material is ceramic material or plastic material.

8. The bonding structure as claimed in claim 7, wherein the plastic material includes any one of epoxy, resin, and acrylic acid.

9. The bonding structure as claimed in claim 1 further comprising a fixing glue coated on an adhesion position of the extension and the electric circuit.

10. A method of bonding a chip with an electronic circuit comprises steps of:
    mounting the chip on a chip holder;
    electrically connecting the chip with multiple conductive feet;
    covering the chip and the multiple conductive feet by using a packaging material, wherein a part of each of the multiple conductive feet exposes outside the packaging material to form an extension;
    forming an electric circuit on a porous substrate, wherein the electric circuit is formed from conductive inks which penetrate into the porous substrate so as to produce an electric circuit; and
    inserting the extension through the electric circuit, hence the extension is electrically connected with the electric circuit.

11. The method as claimed in claim 10, wherein the chip is mounted on the chip holder by way of epoxy resin.

12. The method as claimed in claim 10, wherein the chip is electrically connected with each conductive foot by using a gold wire in a wire bonding manner.

13. The method as claimed in claim 10, wherein the porous substrate is made of paper or is a polymer film, and the polymer film is surface treaded.

14. The method as claimed in claim 13, wherein the polymer film is made of polyethylene terephthalate (PET) or polyimide (PI).

15. The method as claimed in claim 10, wherein the packaging material is ceramic material or plastic material.

16. The method as claimed in claim 15, wherein the plastic material includes any one of epoxy, resin, and acrylic acid.

17. The method as claimed in claim 10 further step of fixing the extension of each conductive foot on an adhesion position of the extension and the electric circuit by way of epoxy resin.

* * * * *